United States Patent
O et al.

(10) Patent No.: US 7,342,282 B2
(45) Date of Patent: Mar. 11, 2008

(54) COMPACT SCR DEVICE AND METHOD FOR INTEGRATED CIRCUITS

(75) Inventors: Hugh Sungki O, Fremont, CA (US); Chih-Ching Shih, Pleasanton, CA (US); Cheng-Hsiung Huang, Cupertino, CA (US); Yow-Juang Liu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 129 days.

(21) Appl. No.: 10/938,102

(22) Filed: Sep. 10, 2004

(65) Prior Publication Data
US 2006/0054974 A1    Mar. 16, 2006

(51) Int. Cl.
*H01L 29/74* (2006.01)
(52) U.S. Cl. ............... 257/362; 257/122; 257/356; 257/E29.22; 257/E29.219
(58) Field of Classification Search ........ 257/355–357, 257/362
See application file for complete search history.

(56) References Cited

U.S. PATENT DOCUMENTS

| | | | | |
|---|---|---|---|---|
| 5,576,557 A * | 11/1996 | Ker et al. | ............ | 257/173 |
| 5,587,595 A * | 12/1996 | Neubrand et al. | ..... | 257/141 |
| 5,959,820 A * | 9/1999 | Ker et al. | ............ | 361/111 |
| 6,008,684 A * | 12/1999 | Ker et al. | ............ | 327/428 |
| 6,011,681 A * | 1/2000 | Ker et al. | ............ | 361/111 |
| 6,242,763 B1 * | 6/2001 | Chen et al. | ............ | 257/107 |
| 6,573,566 B2 * | 6/2003 | Ker et al. | ............ | 257/355 |
| 6,610,262 B1 * | 8/2003 | Peng et al. | ............ | 423/197 |
| 6,661,060 B2 * | 12/2003 | Lee et al. | ............ | 257/355 |
| 6,720,623 B2 * | 4/2004 | Chen | ............ | 257/355 |
| 6,737,682 B1 * | 5/2004 | Yu | ............ | 257/173 |
| 6,909,149 B2 * | 6/2005 | Russ et al. | ............ | 257/355 |
| 2001/0036050 A1 * | 11/2001 | Lee et al. | ............ | 361/56 |
| 2002/0081783 A1 * | 6/2002 | Lee et al. | ............ | 438/133 |
| 2003/0146474 A1 | 8/2003 | Ker et al. | | |
| 2003/0205761 A1 * | 11/2003 | Chang | ............ | 257/355 |
| 2004/0021998 A1 * | 2/2004 | Salome et al. | ............ | 361/56 |
| 2004/0033645 A1 * | 2/2004 | Yu | ............ | 438/133 |
| 2004/0065895 A1 * | 4/2004 | Lai et al. | ............ | 257/107 |
| 2004/0207021 A1 * | 10/2004 | Russ et al. | ............ | 257/355 |

\* cited by examiner

*Primary Examiner*—Jerome Jackson
(74) *Attorney, Agent, or Firm*—Morgan, Lewis & Bockius LLP (57) ABSTRACT

A semiconductor device and method for electrostatic discharge protection. The semiconductor device includes a first semiconductor controlled rectifier and a second semiconductor controlled rectifier. The first semiconductor controlled rectifier includes a first semiconductor region and a second semiconductor region, and the second semiconductor controlled rectifier includes the first semiconductor region and the second semiconductor region. The first semiconductor region is associated with a first doping type, and the second semiconductor region is associated with a second doping type different from the first doping type. The second semiconductor region is located directly on an insulating layer.

25 Claims, 12 Drawing Sheets

COMPACT SCR DEVICE AND METHOD FOR INTEGRATED CIRCUITS

CROSS-REFERENCES TO RELATED APPLICATIONS

Not Applicable

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates generally to electrostatic discharge (ESD) protection. More specifically, the invention provides a compact semiconductor controlled rectifier (SCR) device and method. Merely by way of example, the invention has been applied to integrated circuits with silicon on insulator (SOI), but it would be recognized that the invention has a much broader range of applicability.

The integrated circuits may be damaged by the discharge of electrostatic energy. The damage may be prevented by protection devices or circuits which shunt the ESD energy away from the integrated circuits. The protection devices include at least semiconductor controlled rectifiers, bipolar clamping devices, and diode clamping devices. For example, a semiconductor controlled rectifier may be a silicon controlled rectifier. The protection capability is usually defined as the maximum protected ESD pulse amplitude for a given contact width. The smaller the contact width for a given ESD pulse amplitude protection, the better the ESD protection devices are.

The semiconductor controlled rectifiers are attractive for protecting the integrated circuits. The SCR devices usually provide good current-carrying capability and low capacitance. The PNP and NPN bipolar transistors of the SCR devices provide positive feedbacks in an electrostatic event, so the discharge capacity of the SCR devices is often favorable. Additionally, the pin capacitance added by the SCR devices is usually negligible; thus the high-speed pin performance may be maintained.

The SCR devices can conduct current from one electrode to another electrode. For example, when positive ESD charges are applied to the anode, the SCR devices can turn on and discharge to the cathode. To discharge negative charges, diodes may be added to the SCR devices. But the diodes can significantly increase junction capacitance and lead to substantial pin leakage during operation. An alternative solution is to use both PNPN SCR devices and NPNP SCR devices. The PNPN SCR takes care of the positive discharge, and the NPNP SCR takes care of the negative discharge. But the two types of SCR devices take a large area of the integrated systems.

Hence it is desirable to improve ESD protection techniques.

BRIEF SUMMARY OF THE INVENTION

The present invention relates generally to electrostatic discharge (ESD) protection. More specifically, the invention provides a compact semiconductor controlled rectifier (SCR) device and method. Merely by way of example, the invention has been applied to integrated circuits with silicon on insulator (SOI), but it would be recognized that the invention has a much broader range of applicability.

According to an embodiment of the present invention, a semiconductor device for electrostatic discharge protection includes two semiconductor controlled rectifiers. One of the two semiconductor controlled rectifier includes two semiconductor regions, and the other of the two semiconductor controlled rectifier includes the same two semiconductor regions. One of the two semiconductor regions is associated with a doping type, and the other of the two semiconductor regions is associated with another doping type and located directly on an insulating layer.

Many benefits are achieved by way of the present invention over conventional techniques. For example, certain embodiments of the present invention provide a single device allowing ESD discharge in both polarity. For example, the single device includes both PNPN SCR and NPNP SCR, and PNPN SCR and NPNP SCR share diffusion areas. Some embodiments of the present invention provide fast turn-on of the device for effective ESD protection. Certain embodiments of the present invention provide low capacitance that allows protection of high-speed pins. Some embodiments of the present invention use smaller area than two separate SCR devices. Certain embodiments of the present invention use double triggering of the PNP and the NPN bipolar transistors. Some embodiments of the present invention provide control diodes to turn-on either PNPN SCR or NPNP SCR. The control diodes also raise the holding voltage of PNPN SCR and NPNP SCR to eliminate or reduce the latch-up during operation.

According to another embodiment of the present invention, a semiconductor device for electrostatic discharge protection includes a first semiconductor controlled rectifier and a second semiconductor controlled rectifier. The first semiconductor controlled rectifier includes a first semiconductor region and a second semiconductor region, and the second semiconductor controlled rectifier includes the first semiconductor region and the second semiconductor region. The first semiconductor region is associated with a first doping type, and the second semiconductor region is associated with a second doping type different from the first doping type. The second semiconductor region is located directly on an insulating layer.

According to yet another embodiment of the present invention, a semiconductor device for electrostatic discharge protection includes a first semiconductor controlled rectifier, and a second semiconductor controlled rectifier. The first semiconductor controlled rectifier includes a first semiconductor region, a second semiconductor region, a third semiconductor region, and a fourth semiconductor region. The second semiconductor controlled rectifier includes the first semiconductor region, the second semiconductor region, a fifth semiconductor region, and a sixth semiconductor region. The second semiconductor region is in contact with the fourth semiconductor region and the sixth semiconductor region. The second semiconductor region, the fourth semiconductor region, and the sixth semiconductor region each are located directly on an insulating layer. The fourth semiconductor region and the sixth semiconductor region each are associated with a first doping type, and the second semiconductor region is associated with a second doping type different from the first doping type.

According to yet another embodiment of the present invention, a method for making a semiconductor device for electrostatic discharge protection includes forming a first semiconductor controlled rectifier and a second semiconductor controlled rectifier. The forming a first semiconductor controlled rectifier and a second semiconductor controlled rectifier includes forming a first semiconductor layer on an insulating layer, forming a first region and a second region in the first semiconductor layer and directly on the insulating layer, and forming a third region in the first semiconductor layer and directly on the insulating layer. The first region and the second region each are associated with a first doping type, and the third region is associated with a second doping type different from the first doping type. The forming a first semiconductor controlled rectifier and a second semiconductor controlled rectifier includes forming a fourth region and a fifth region in the first region and the second region respectively, and forming a sixth region in the third region. The fourth region and the fifth region each are associated with the second doping type, and the sixth region associated with the first doping type.

Depending upon embodiment, one or more of these benefits may be achieved. These benefits and various additional objects, features and advantages of the present invention can be fully appreciated with reference to the detailed description and accompanying drawings that follow.

DETAILED DESCRIPTION OF THE INVENTION

The present invention relates generally to electrostatic discharge (ESD) protection. More specifically, the invention provides a compact semiconductor controlled rectifier (SCR) device and method. Merely by way of example, the invention has been applied to integrated circuits with silicon on insulator (SOI), but it would be recognized that the invention has a much broader range of applicability.

Figure 1:
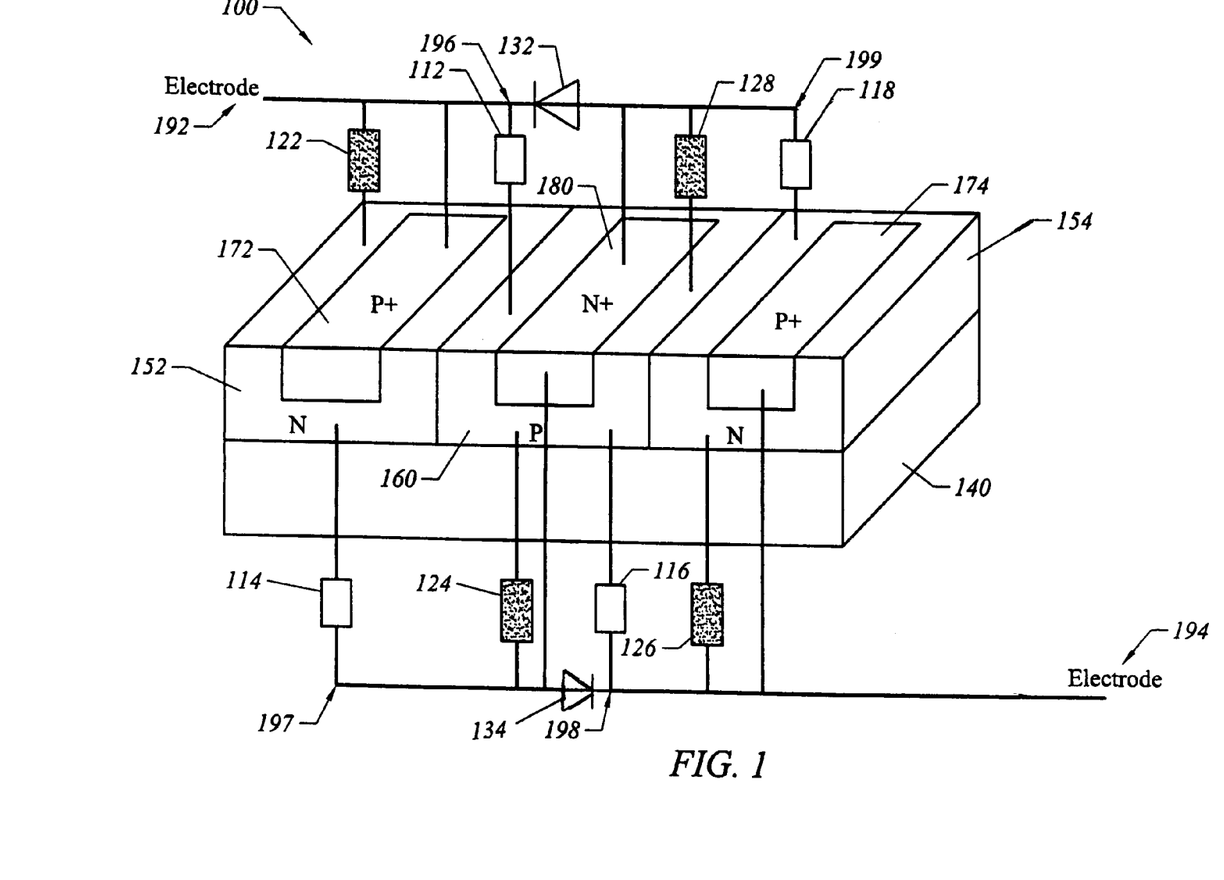
FIG. 1 is a simplified diagram for a compact SCR device according to an embodiment of the present invention.

FIG. 1 is a simplified diagram for a compact SCR device according to an embodiment of the present invention. This diagram is merely an example, which should not unduly limit the scope of the claims herein. The device 100 includes triggering devices 112, 114, 116, and 118, resistors 122, 124, 126, and 128, diodes 132 and 134, insulating layer 140, n regions 152 and 154, p region 160, p+ regions 172 and 174, n+ region 180, and electrodes 192 and 194. Although the above has been shown using a selected group of components, there can be many alternatives, modifications, and variations. Depending upon the embodiment, the specific arrangements of components may be interchanged with others replaced. Further details of these components are found throughout the present specification and more particularly below.

In one embodiment, the insulating layer 140 is composed of a dielectric material. For example, the dielectric material includes at least one of silicon oxide, silicon nitride, and silicon oxynitride. In another example, the dielectric material is silicon oxide. The thickness of the insulating layer 140 has various values. For example, the thickness is about a few hundred angstroms. In another example, the thickness ranges from 300 Å to 900 Å. In one embodiment, the insulating layer 140 is located on another layer. For example, the insulating layer 140 is formed on a bulk silicon layer. The bulk silicon layer may have a thickness value of about a few thousand microns.

The n regions 152 and 154 and the p region 160 each are located on the insulating layer 140. In one embodiment, the n regions 152 and 154 and the region 160 each have a thickness value of about a few hundred angstroms. In another embodiment, the regions 152, 154, and 160 each have a thickness value ranging from 300 Å to 2000 Å. For example, the regions 152, 154, and 160 have the same thickness value. In another example, the regions 152, 154, and 160 have different thickness values.

In one embodiment, the n regions 152 and 154 and the p region 160 each are composed of a semiconductor material. For example, the semiconductor material includes at least one of silicon, germanium, and gallium arsenide. In another example, the semiconductor material is silicon. The n regions 152 and 154 each are doped with arsenic, phosphorous, and/or other n-type dopants. The doping levels each may range from $1\times10^{16}/cm^3$ to $1\times10^{18}/cm^3$. The p region 160 is doped with boron and/or other p-type dopants. The doping level may range from $1\times10^{16}/cm^3$ to $1\times10^{18}/cm^3$.

The p+ regions 172 and 174 and n+ region 180 each are located within the n regions 152 and 154 and the p region 160 respectively. In one embodiment, the p+ regions 172 and 174 and the n+ region 180 each have a thickness value of about a few hundred angstroms. In another embodiment, the regions 172, 174, and 180 each have a thickness value ranging from 50 Å to 2000 Å. For example, the regions 172, 174, and 180 have the same thickness value. In another example, the regions 172, 174, and 180 have different thickness values.

In one embodiment, the regions 172, 174, and 180 each are composed of a semiconductor material. For example, the semiconductor material includes at least one of silicon, germanium, and gallium arsenide. In another example, the semiconductor material is silicon. The p+ regions 172 and 174 each are doped with boron and/or other p-type dopants. The doping levels each may range from $1 \times 10^{17}/cm^3$ to $1 \times 10^{20}/cm^3$. The n+ region 180 is doped with arsenic, phosphorous, and/or other n-type dopants. The doping level may range from $1 \times 10^{17}/cm^3$ to $1 \times 10^{20}/cm^3$.

The triggering devices 112, 114, 116, and 118 each include at least a diode, a transistor, or other electrical component. In one embodiment, the triggering devices 112, 114, 116, and 118 each is a diode. For example, the diode 112 has a forward-bias direction from the p region 160 to a node 196. The diode 114 has a forward-bias direction from a node 197 to the n region 152. The diode 116 has a forward-bias direction from the p region 160 to a node 198. The diode 118 has a forward-bias direction from a node 199 to the n region 154. In another example, the diodes 112, 114, 116, and 118 each have a break-down voltage ranging from 1.0V to 7.5V.

The resistors 122, 124, 126, and 128 are located between the electrode 192 and the n region 152, between the node 197 and the p region 160, between the node 198 and the n region 154, and between the node 199 and the p region 160, respectively. In one embodiment, the resistors 122, 124, 126, and 128 each have various resistance values. For example, the resistors each have a resistance value ranging from 100 Ω to 500K Ω.

The diodes 132 and 134 each have a forward-bias direction form the node 199 to the electrode 192 and from the node 197 to the electrode 194 respectively. For example, the diodes 132 and 134 each have a break-down voltage ranging from 1.0V to 7.5V. The electrode 192 has a voltage potential substantially equal to the node 196, and the electrode 194 has a voltage potential substantially equal to the node 198. In one embodiment, the electrode 192 is connected to a pin of an integrated circuit, and the electrode 194 is connected to a constant voltage source, such as a ground level. In another embodiment, the electrode 194 is connected to a pin of an integrated circuit, and the electrode 192 is connected to a constant voltage source, such as a ground level.

As discussed above and further emphasized here, FIG. 1 is merely an example, which should not unduly limit the scope of the claims herein. One of ordinary skill in the art would recognize many variations, modifications, and alternatives. For example, the p+ regions 172 and 174 each is replaced by a p region. In another example, the n+ region 180 is replaced by a n region. In another example, the regions 152, 154, 172, 174, 160, and 180 are, completely or partially, covered by an interconnect layer and/or a metal dielectric layer.

Figure 2:
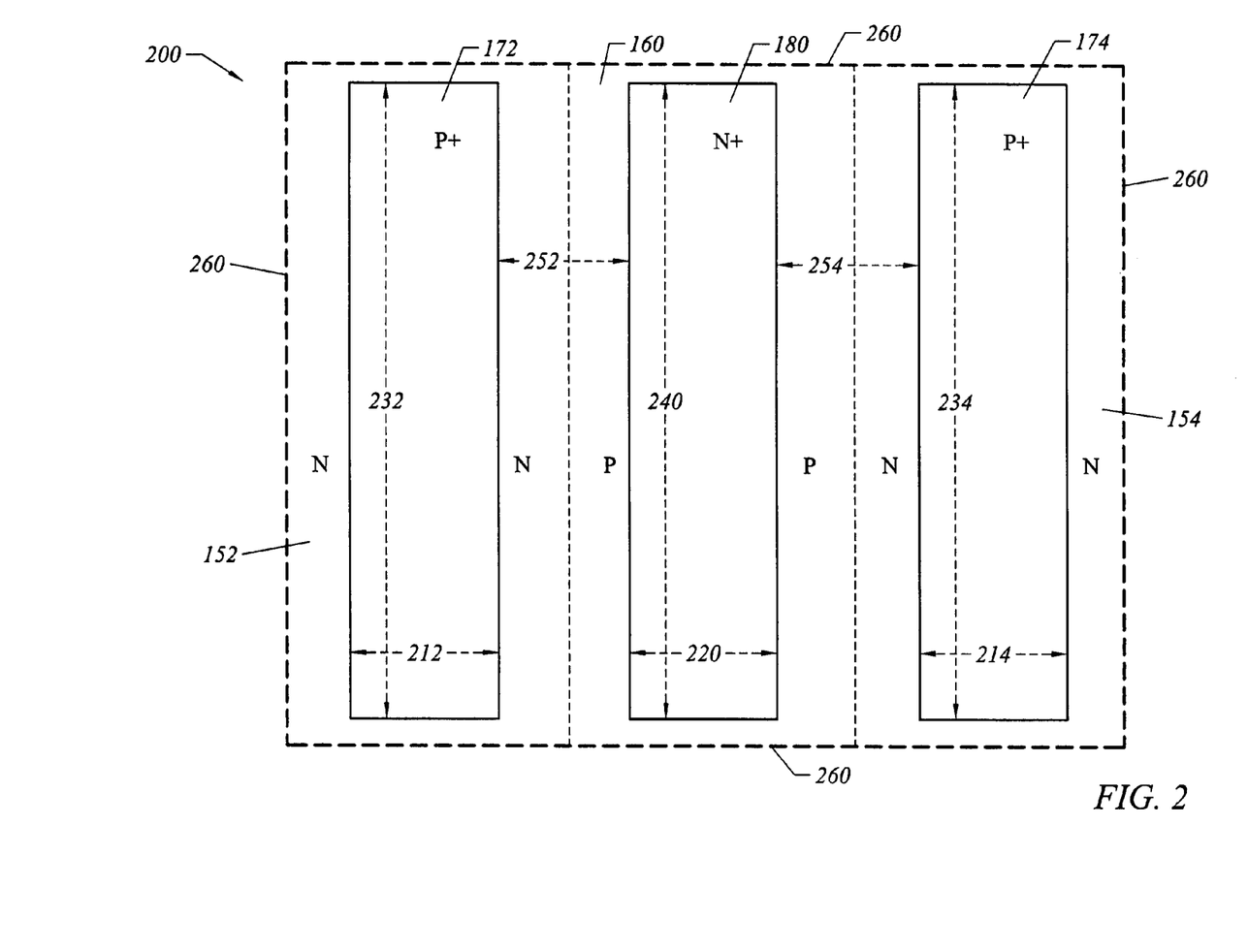
FIG. 2 is a simplified top view for a compact SCR device according to an embodiment of the present invention.

FIG. 2 is a simplified top view for a compact SCR device according to an embodiment of the present invention. This diagram is merely an example, which should not unduly limit the scope of the claims herein. The device 200 as shown in FIG. 2 includes the n regions 152 and 154, the p region 160, the p+ regions 172 and 174, and the n+ region 180. These components in addition to triggering devices 112, 114, 116, and 118, resistors 122, 124, 126, and 128, diodes 132 and 134, insulating layer 140, and electrodes 192 and 194 form the device 100. Although the above has been shown using a selected group of components, there can be many alternatives, modifications, and variations. Depending upon the embodiment, the specific arrangements of components may be interchanged with others replaced. Further details of these components are found throughout the present specification and more particularly below.

As shown in FIG. 2, the p+ regions 172 and 174 have a width 232 and 234 respectively, and the n+ region 180 has a width 240. The widths 232, 234, and 240 each have various values. In one embodiment, the widths each range from 40 µm to 80 µm. In another embodiment, the widths each depend on the maximum discharge current and the maximum current density. For example, if the maximum current density is 0.05 A/µm and the maximum discharge current is 4 A, the width 232, 234, or 240 equals 80 µm.

Also, the p+ regions 172 and 174 have a length 212 and 214 respectively, and the n+ region 180 has a length 220. The lengths 212, 214, and 220 each have various values. In one embodiment, the lengths each range from 0.84 µm to 2 µm. The p+ region 172 and the n+ region 180 are spaced apart by a separation 252, and the p+ region 174 and the n+ region 180 are spaced apart by a separation 254. The separations 252 and 254 each have various values. For example, the separations each range from 0.20 µm to 2 µm. In one embodiment, the boundary 260 of the device 200 is either partially and fully surrounded by an isolation region. For example, the isolation region includes at least a shallow trench isolation area. In another example, the isolation region includes at least a field oxide area.

Figure 3:
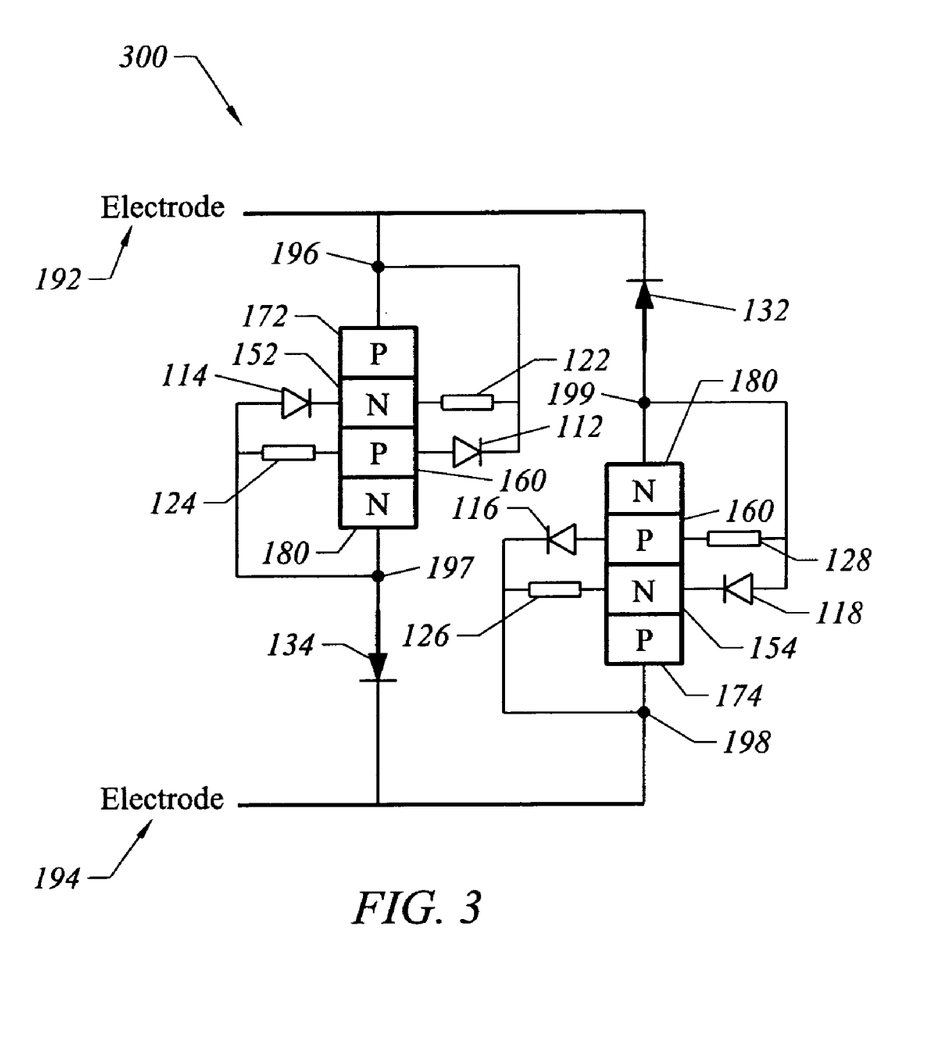
FIG. 3 is a simplified circuit diagram for the compact SCR device 100 according to an embodiment of the present invention.

FIG. 3 is a simplified circuit diagram for the compact SCR device 100 according to an embodiment of the present invention. This diagram is merely an example, which should not unduly limit the scope of the claims herein. The circuit 300 includes the triggering devices 112, 114, 116, and 118, the resistors 122, 124, 126, and 128, the diodes 132 and 134, the n regions 152 and 154, the p region 160, the p+regions 172 and 174, the n+ region 180, and the electrodes 192 and 194. Although the above has been shown using a selected group of components, there can be many alternatives, modifications, and variations. Depending upon the embodiment, the specific arrangements of components may be interchanged with others replaced. Further details of these components are found throughout the present specification and more particularly below.

For example, the triggering devices 112, 114, 116, and 118 each include a diode. Yet in another example, the triggering devices 112, 114, 116, and 118 each include a transistor or other electrical component. Also, the n regions 152 and 154 and the p region 160 are located on the insulating layer 140.

As shown in FIG. 3, the circuit 300 includes a PNPN component and a NPNP component. The PNPN component includes the regions 172, 152, 160, and 180, and the NPNP component includes the regions 180, 160, 154, and 174. In one embodiment, the PNPN component provides ESD protection against positive charges on the electrode 192, and NPNP component provides ESD protection against negative charges on the electrode 192. The electrode 194 is for example grounded.

In one embodiment, the diodes 132 and 134 guide the discharge current of the PNPN component and the NPNP component. For example, the diode 134 allows the positive ESD current to flow through the PNPN component, not the NPNP component, from the electrode 192. In another example, the diode 132 allows the negative ESD current to flow through only the NPNP component, not the PNPN component, from the electrode 192. In another embodiment, the diodes 132 and 134 control the holding voltage of the PNPN component and the NPNP component respectively. For example, the electrode 192 is connected to a pin of an integrated circuit. The magnitude of the holding voltage should be higher than the magnitude of the operating voltage of the pin under protection.

As discussed above and further emphasized here, FIGS. 1-3 are merely examples, which should not unduly limit the scope of the claims herein. One of ordinary skill in the art would recognize many variations, modifications, and alternatives. For example, the diode 132 and 134 each may be replaced by a plurality of diodes.

Figure 4:
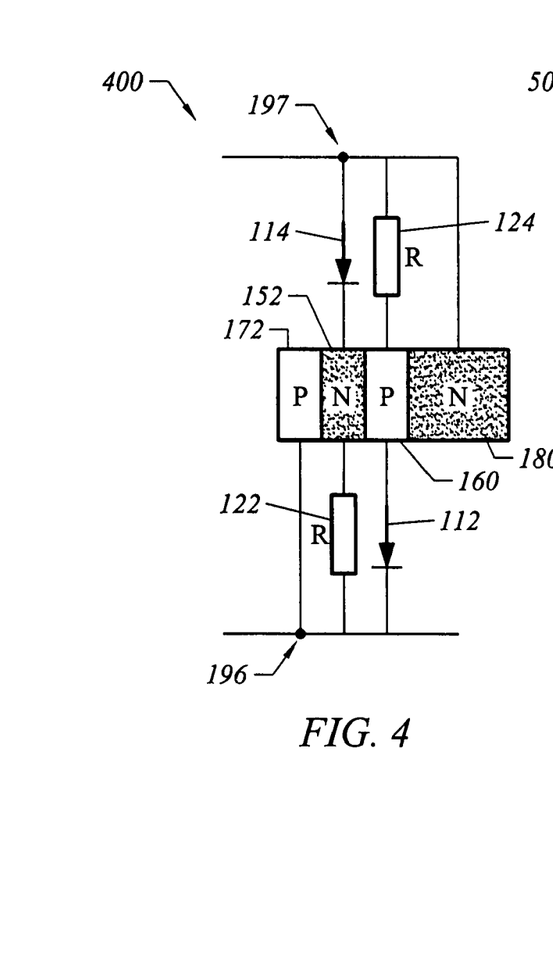
FIG. 4 is a simplified triggering diagram for PNPN component of compact SCR device according to an embodiment of the present invention.

FIG. 4 is a simplified triggering diagram for PNPN component of compact SCR device 100 according to an embodiment of the present invention. This diagram is merely an example, which should not unduly limit the scope of the claims herein. The triggering circuit 400 is a part of the circuit 300 and includes the triggering devices 112 and 114, the resistors 122 and 124, the n region 152, the p region 160, the p+ region 172, and the n+ region 180. Although the above has been shown using a selected group of components, there can be many alternatives, modifications, and variations. Depending upon the embodiment, the specific arrangements of components may be interchanged with others replaced. Further details of these components are found throughout the present specification and more particularly below.

As shown in FIG. 4, during normal operation, the diodes 112 and 114 are not conductive. During an ESD event, the diodes 112 and 114 break down under reverse-bias voltages respectively. A resulting current flows through the diode 112 and the resistor 124, and another resulting current flows through the resistor 122 and the diode 114. The potential differences between two ends of the resistor 124 and between two ends of the resistor 122 forward bias the emitter-base junctions and turn on the PNPN component. The discharge current flows from the region 172 to the region 180 through the regions 152 and 160.

Figure 5:
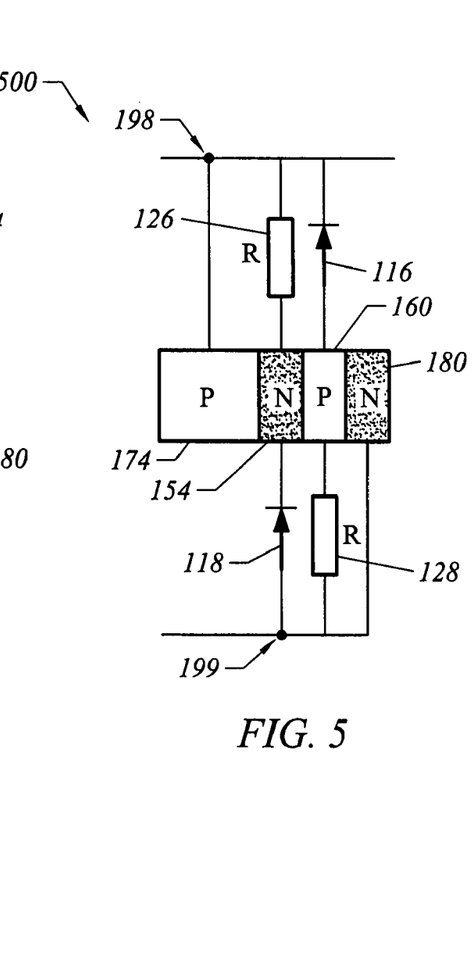
FIG. 5 is a simplified triggering diagram for NPNP component of compact SCR device according to an embodiment of the present invention.

FIG. 5 is a simplified triggering diagram for NPNP component of compact SCR device 100 according to an embodiment of the present invention. This diagram is merely an example, which should not unduly limit the scope of the claims herein. The triggering circuit 500 is a part of the circuit 300 and includes the triggering devices 116 and 118, the resistors 126 and 128, the n region 154, the p region 160, the p+ region 174, and the n+ region 180. Although the above has been shown using a selected group of components, there can be many alternatives, modifications, and variations. Depending upon the embodiment, the specific arrangements of components may be interchanged with others replaced. Further details of these components are found throughout the present specification and more particularly below.

As shown in FIG. 5, during normal operation, the diodes 116 and 118 are not conductive. During an ESD event, the diodes 116 and 118 break down under reverse-bias voltages respectively. A resulting current flows through the diode 116 and the resistor 128, and another resulting current flows through the resistor 126 and the diode 118. The potential differences between two ends of the resistor 128 and between two ends of the resistor 126 forward bias the emitter-base junctions and turn on the NPNP component. The discharge current flows from the region 174 to the region 180 through the regions 154 and 160.

Figure 6:
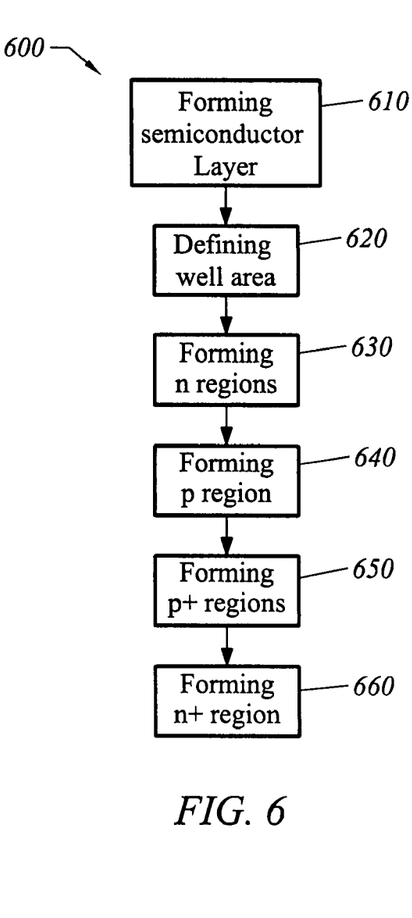
FIG. 6 is a simplified method for making the compact SCR device according to an embodiment of the present invention.

FIG. 6 is a simplified method for making the compact SCR device 100 according to an embodiment of the present invention. This diagram is merely an example, which should not unduly limit the scope of the claims herein. The method 600 includes process 610 for forming semiconductor layer, process 620 for defining well area, process 630 for forming n regions, process 640 for forming p region, process 650 for forming p+ regions, process 660 for forming n+ region. Although the above has been shown using a selected sequence of processes, there can be many alternatives, modifications, and variations. For example, some of the processes may be expanded and/or combined. The process 620 may be skipped or combined with the process 610 or the process 630. Other processes may be inserted to those noted above. For example, processes for making some or all of the triggering devices 112, 114, 116, and 118, resistors 122, 124, 126, and 128, diodes 132 and 134, and electrodes 192 and 194 may be performed during or in addition to processes 610, 620, 630, 640, 650, and 660. In another example, an interconnect layer and/or a metal dielectric layer are formed on the entire or partial regions 152, 154, 172, 174, 160, and 180. Depending upon the embodiment, the specific sequences of processes may be interchanged with others replaced. Further details of these components are found throughout the present specification and more particularly below.

Figure 7:
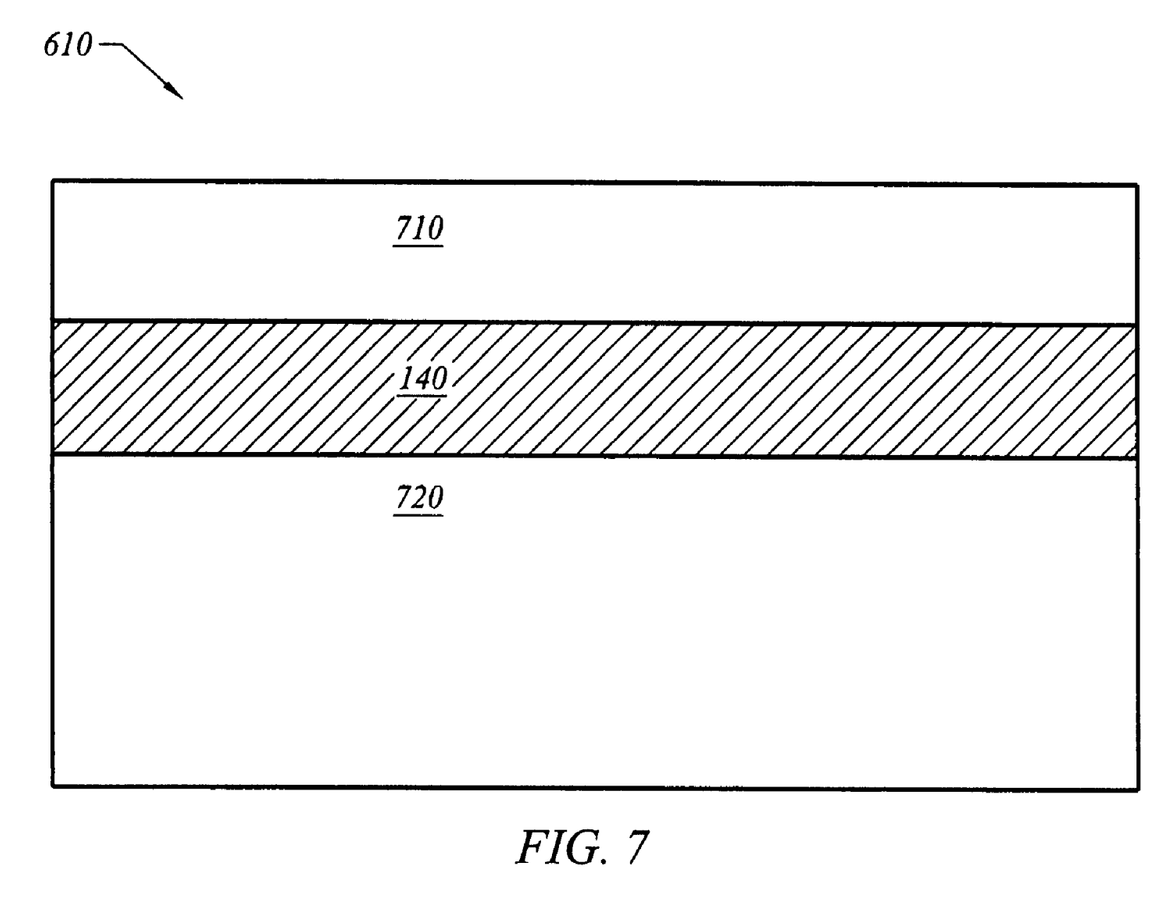
FIG. 7 is a simplified process for making semiconductor layer according to an embodiment of the present invention.

At the process 610, a semiconductor layer is formed. FIG. 7 is a simplified process for making semiconductor layer according to an embodiment of the present invention. This diagram is merely an example, which should not unduly limit the scope of the claims herein. One of ordinary skill in the art would recognize many variations, modifications, and alternatives. A semiconductor layer 710 is formed on the insulating layer 140. For example, the process 610 uses at least one of chemical vapor deposition (CVD), plasma enhanced chemical vapor deposition (PECVD), low pressure chemical vapor deposition (LPCVD), and sputtering deposition. The semiconductor layer 710 is made of a semiconductor material. In one embodiment, the semiconductor material includes at least one of silicon, germanium, and gallium arsenide. For example, the semiconductor material is silicon. The semiconductor layer 710 has a thickness value of about a few hundred angstroms. For example, the layer 710 has a thickness value ranging from 300 Å to 2000 Å.

In one embodiment, the insulating layer 140 is composed of a dielectric material. For example, the dielectric material includes at least one of silicon oxide, silicon nitride, and silicon oxynitride. In another example, the dielectric material is silicon oxide. The thickness of the insulating layer 140 has various values. For example, the thickness is about a few hundred angstroms. In another example, the thickness ranges from 300 Å to 900 Å. In one embodiment, the insulating layer 140 is located on a layer 720. For example, the layer 720 is made of silicon. The silicon layer 720 may have a thickness value of about a few thousand microns.

Figure 8:
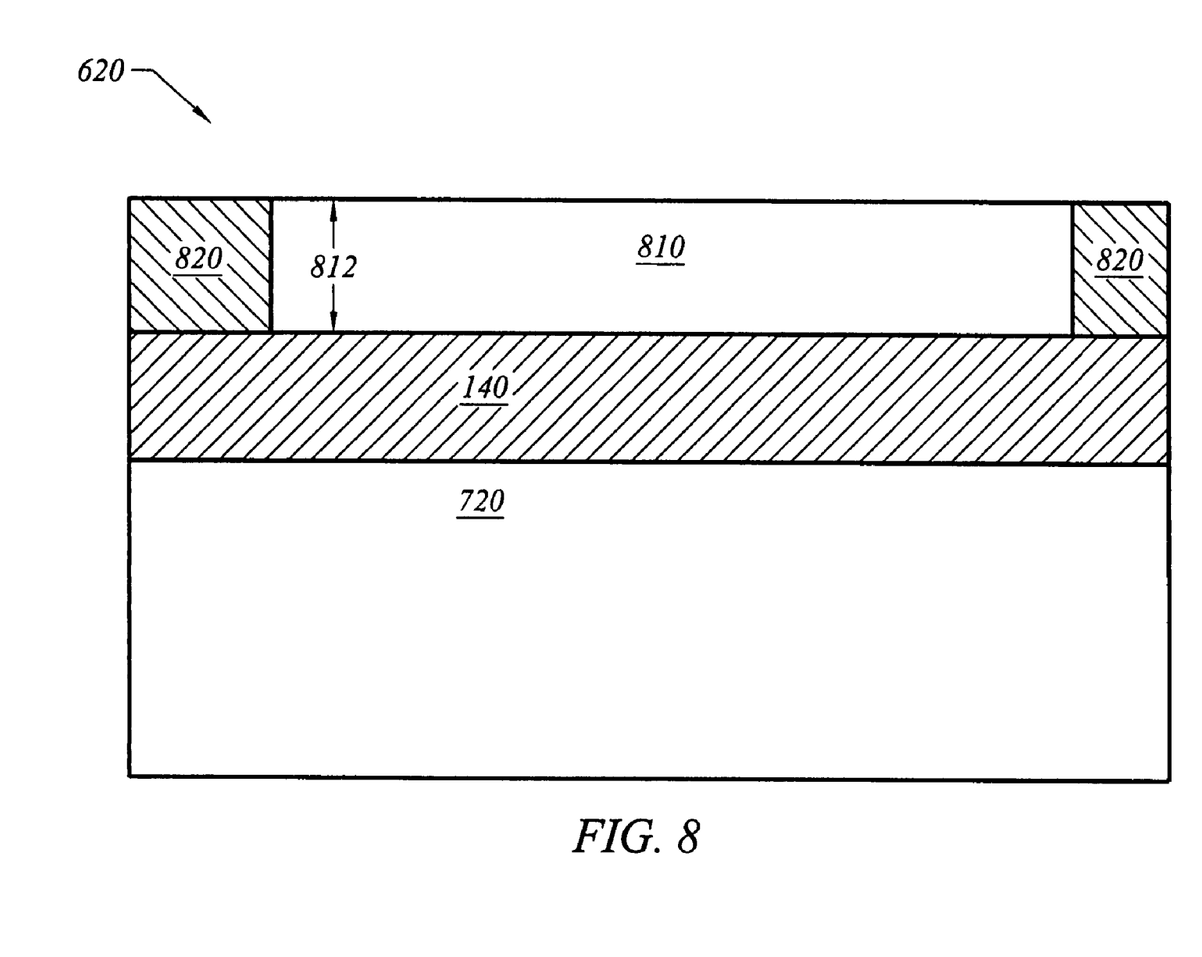
FIG. 8 is a simplified process for defining well area according to an embodiment of the present invention.

At the process 620, a well area is defined. FIG. 8 is a simplified process for defining well area according to an embodiment of the present invention. This diagram is merely an example, which should not unduly limit the scope of the claims herein. One of ordinary skill in the art would recognize many variations, modifications, and alternatives. Part of the semiconductor layer 710 is removed and a well area 810 is defined. The well area 810 is made of a semiconductor material. In one embodiment, the well area 810 has a thickness 812 of about a few hundred angstroms. For example, the thickness 812 ranges from 300 Å to 2000 Å. In another embodiment, the removal of part of the semiconductor layer 710 forms trenches 820. The trenches either partially and fully surround the well area 810. For example, the trenches 820 are further processed to perform a shallow trench isolation area. In one embodiment, the removal of the layer 710 uses dry etching and/or wet etching.

Figure 9:
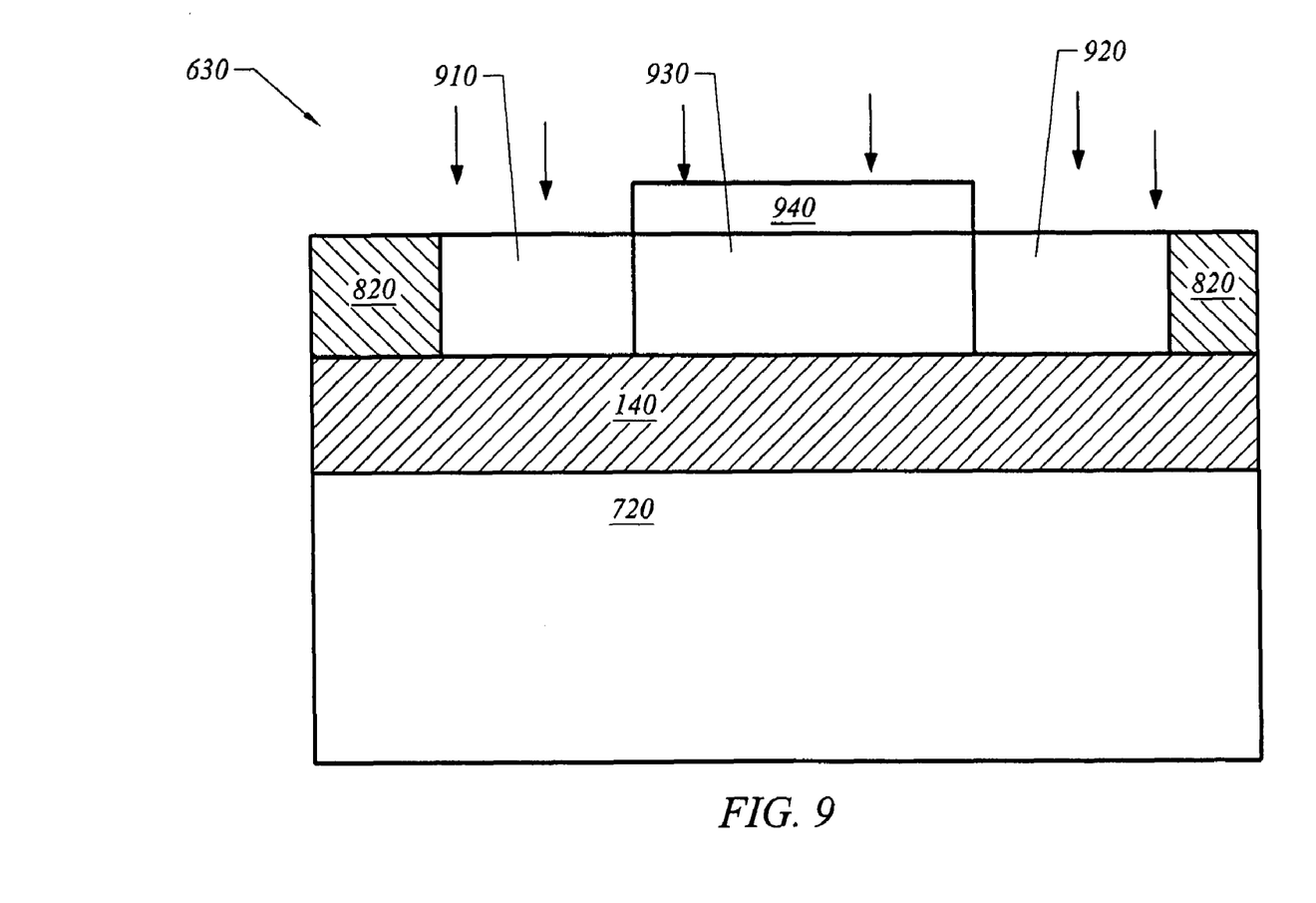
FIG. 9 is a simplified process for forming n regions according to an embodiment of the present invention.

At the process 630, n regions are formed. FIG. 9 is a simplified process for forming n regions according to an embodiment of the present invention. This diagram is merely an example, which should not unduly limit the scope of the claims herein. One of ordinary skill in the art would recognize many variations, modifications, and alternatives. An area 930 of the well area 810 is covered by a protective layer 940. For example, the protective layer 940 includes a nitride layer and/or a photoresist layer. The thickness of the protective layers 1010 and 1020 may range from 1 µm to 10 µm. In one embodiment, the process 630 uses at least one of ion implantation and diffusion doping techniques. For example, the ion implantation process has an implant energy ranging from 50 KeV to 150 KeV and a dose ranging from $1\times10^{16}/cm^3$ to $1\times10^{18}/cm^3$. In another embodiment, the areas 910 and 920 of the well area 810 are doped to n type. For example, the n-type dopants include at least one of arsenic and phosphorous. The doping level may range from $1\times10^{16}/cm^3$ to $1\times10^{18}/cm^3$. In yet another embodiment, the protective layer 940 is removed after the doping process is completed.

Figure 10:
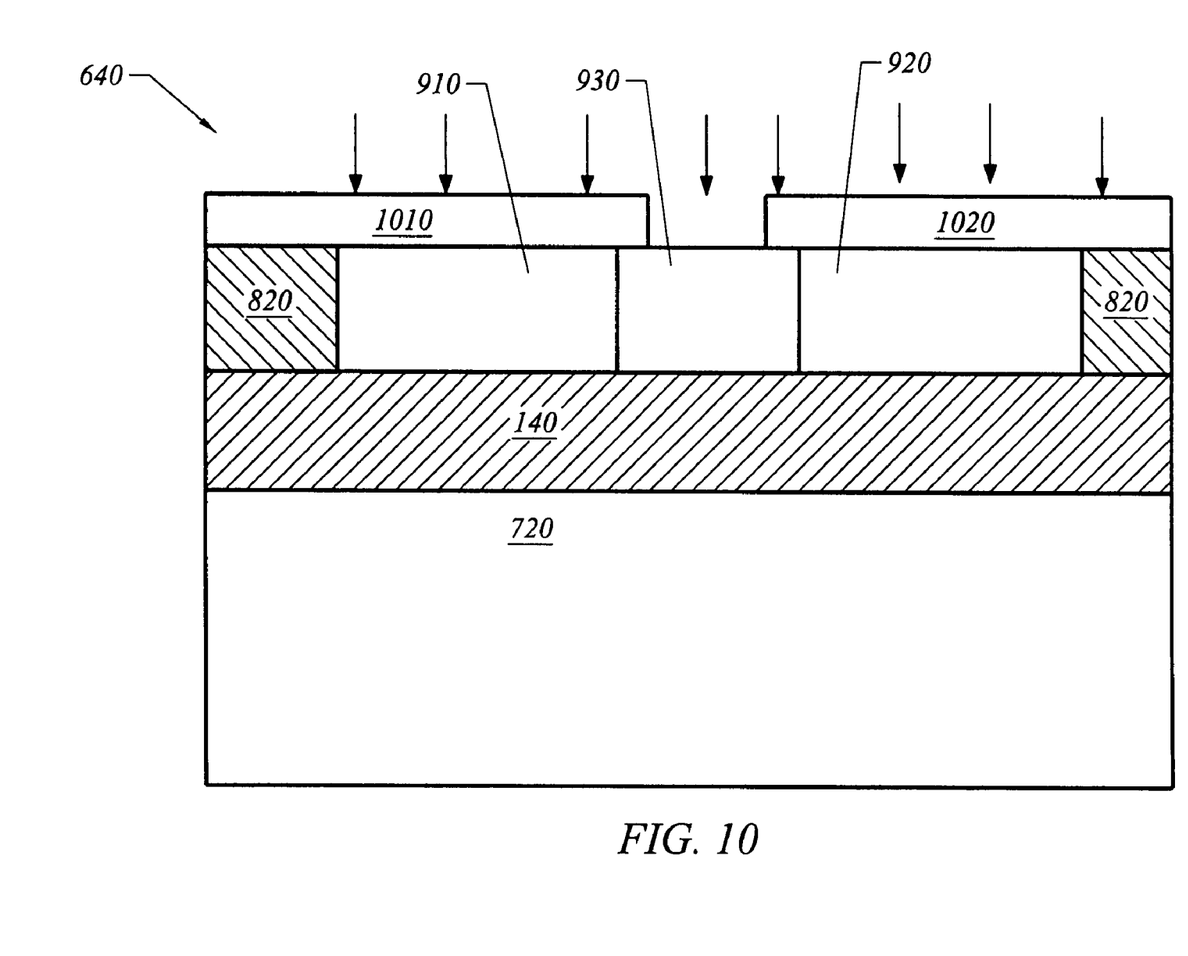
FIG. 10 is a simplified process for forming p region according to an embodiment of the present invention.

At the process 640, a p region is performed. FIG. 10 is a simplified process for forming p region according to an embodiment of the present invention. This diagram is merely an example, which should not unduly limit the scope of the claims herein. One of ordinary skill in the art would recognize many variations, modifications, and alternatives. The areas 910 and 920 of the well area 810 are covered by protective layers 1010 and 1020 respectively. For example, the protective layers 1010 and 1020 each include a nitride layer and/or a photoresist layer. In one embodiment, the thickness of the protective layers 1010 and 1020 may range from 1 µm to 10 µm. For example, the ion implantation process has an implant energy ranging from 50 KeV to 150 KeV and a dose ranging from $1\times10^{16}/cm^3$ to $1\times10^{18}cm^3$. In another embodiment, the area 930 of the well area 810 is doped to p type. For example, the p-type dopants include boron. The doping level may range from $1\times10^{16}/cm^3$ to $1\times10^{18}/cm^3$. In yet another embodiment, the protective layers 1010 and 1020 are removed after the doping process is completed.

Figure 11:
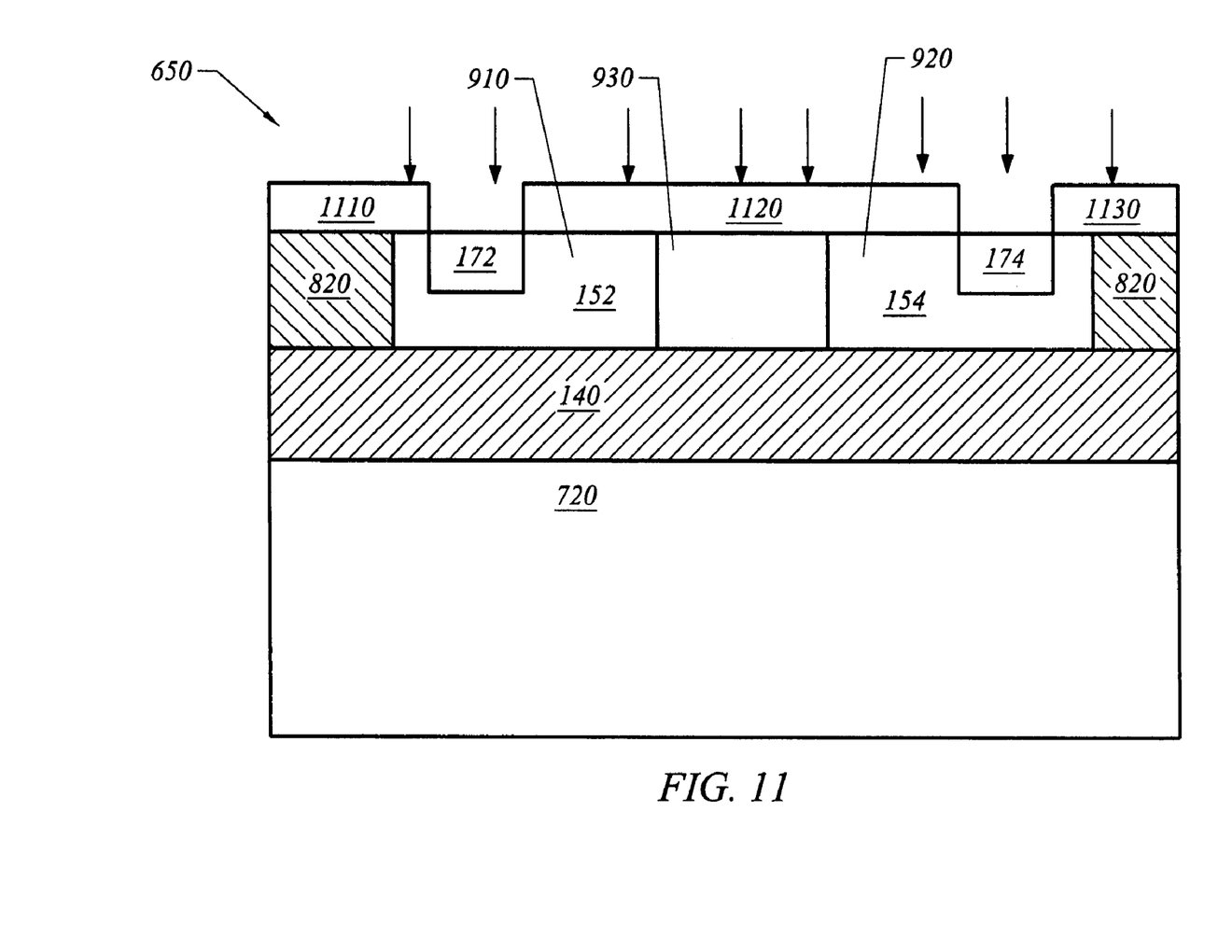
FIG. 11 is a simplified process for forming p+ regions according to an embodiment of the present invention.

At the process 650, p+ regions are formed. FIG. 11 is a simplified process for forming p+ regions according to an embodiment of the present invention. This diagram is merely an example, which should not unduly limit the scope of the claims herein. One of ordinary skill in the art would recognize many variations, modifications, and alternatives. Part of the area 910, the area 930, and part of the area 920 are covered by protective layers 1110, 1120, and 1130 respectively. For example, the protective layers 1110, 1120, and 1130 each include a nitride layer and/or a photoresist layer. In one embodiment, the thickness of the protective layers 1110, 1120, and 1130 may range from 1 µm to 10 µm. For example, the ion implantation process has an implant energy ranging from 20 KeV to 100 KeV and a dose ranging from $1\times10^{17}/cm^3$ to $1\times10^{20}/cm^3$. In another embodiment, the part of the area 910 and the part of the area 920 are doped to p type and form the p+ regions 172 and 174 respectively. The other part of the area 910 and the other part of the area 920 form the n regions 152 and 154 respectively. For example, the p-type dopants include boron. The doping level may range from $1\times10^{17}/cm^3$ to $1\times10^{12}/cm^3$. In another example, the regions 172 and 174 each have a thickness value ranging from 50 Å to 2000 Å. In yet another embodiment, the protective layers 1110, 1120, and 1130 are removed after the doping process is completed.

Figure 12:
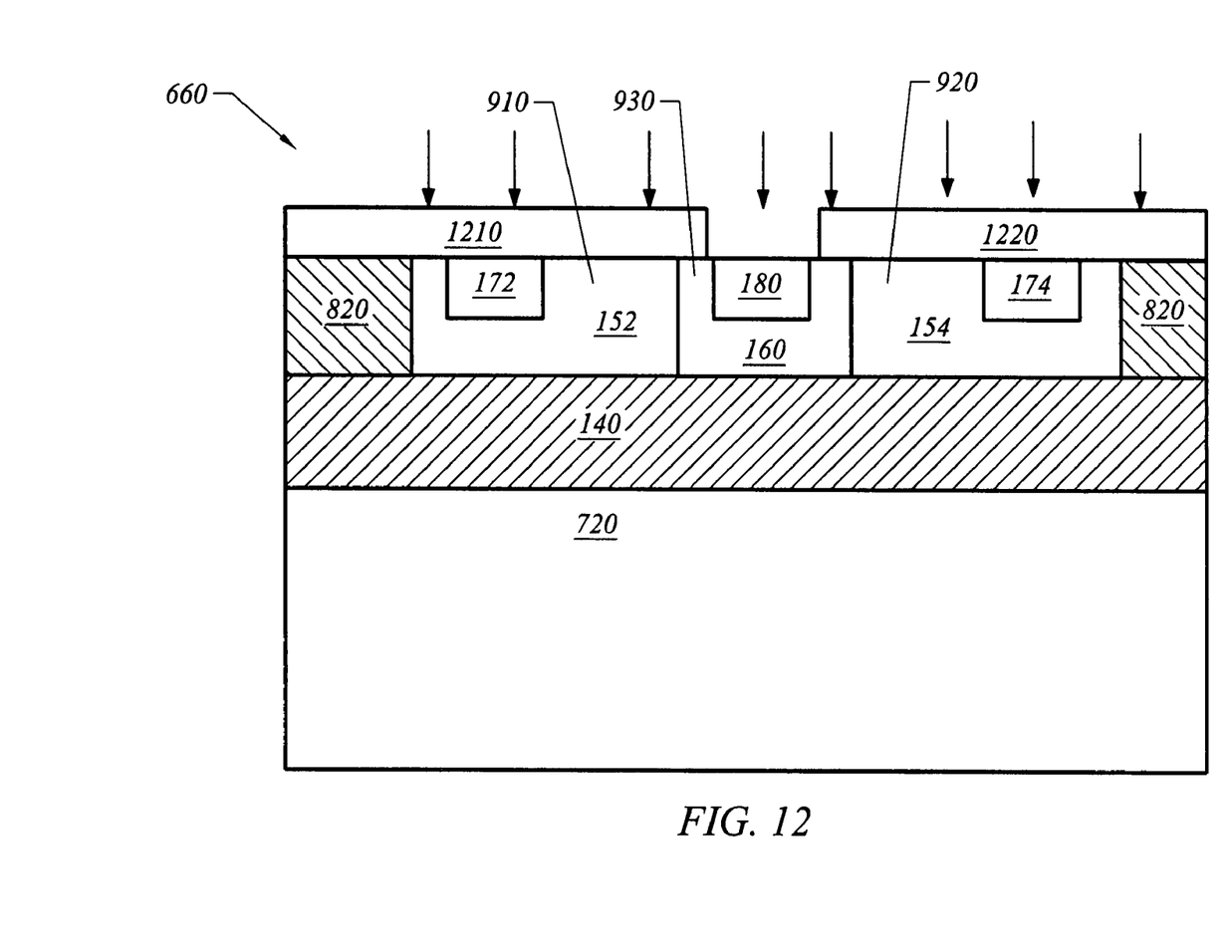
FIG. 12 is a simplified process for forming n+ regions according to an embodiment of the present invention.

At the process 660, an n+ region is formed. FIG. 12 is a simplified process for forming n+ regions according to an embodiment of the present invention. This diagram is merely an example, which should not unduly limit the scope of the claims herein. One of ordinary skill in the art would recognize many variations, modifications, and alternatives. The areas 910 and 920, and part of the area 930 are covered by protective layers 1210 and 1220. For example, the protective layers 1210 and 1220 each include a nitride layer and/or a photoresist layer. The thickness of the protective layers 1210 and 1220 may range from 1 µm to 10 µm. In one embodiment, the process 660 uses at least one of ion implantation and diffusion doping techniques. For example, the ion implantation process has an implant energy ranging from 20 KeV to 100 KeV and a dose ranging from $1\times10^{17}/cm^3$ to $1\times10^{20}/cm^3$. In another embodiment, the part of the area 930 is doped to n type and forms the n+ region 180. The other part of the area 930 forms the p region 160. For example, the n-type dopants include at least one of arsenic and phosphorous. The doping level may range from $1\times10^{17}/cm^3$ to $1\times10^{20}/cm^3$. In another example, the region 180 has a thickness value ranging from 50 Å to 2000 Å. In yet another embodiment, the protective layers 1210 and 1220 are removed after the doping process is completed.

As discussed above and further emphasized here, FIGS. 6-12 are merely examples, which should not unduly limit the scope of the claims herein. One of ordinary skill in the art would recognize many variations, modifications, and alternatives. For example, the process 650 forms the p regions 172 and 174 instead of the p+ regions 172 and 174. In another example, the process 660 forms the n region 180 instead of the n+ region 180. In yet another example, the regions 160, 172, and 174 are doped to n type, and the regions 152, 154, and 180 are doped to p type.

Figure 13:
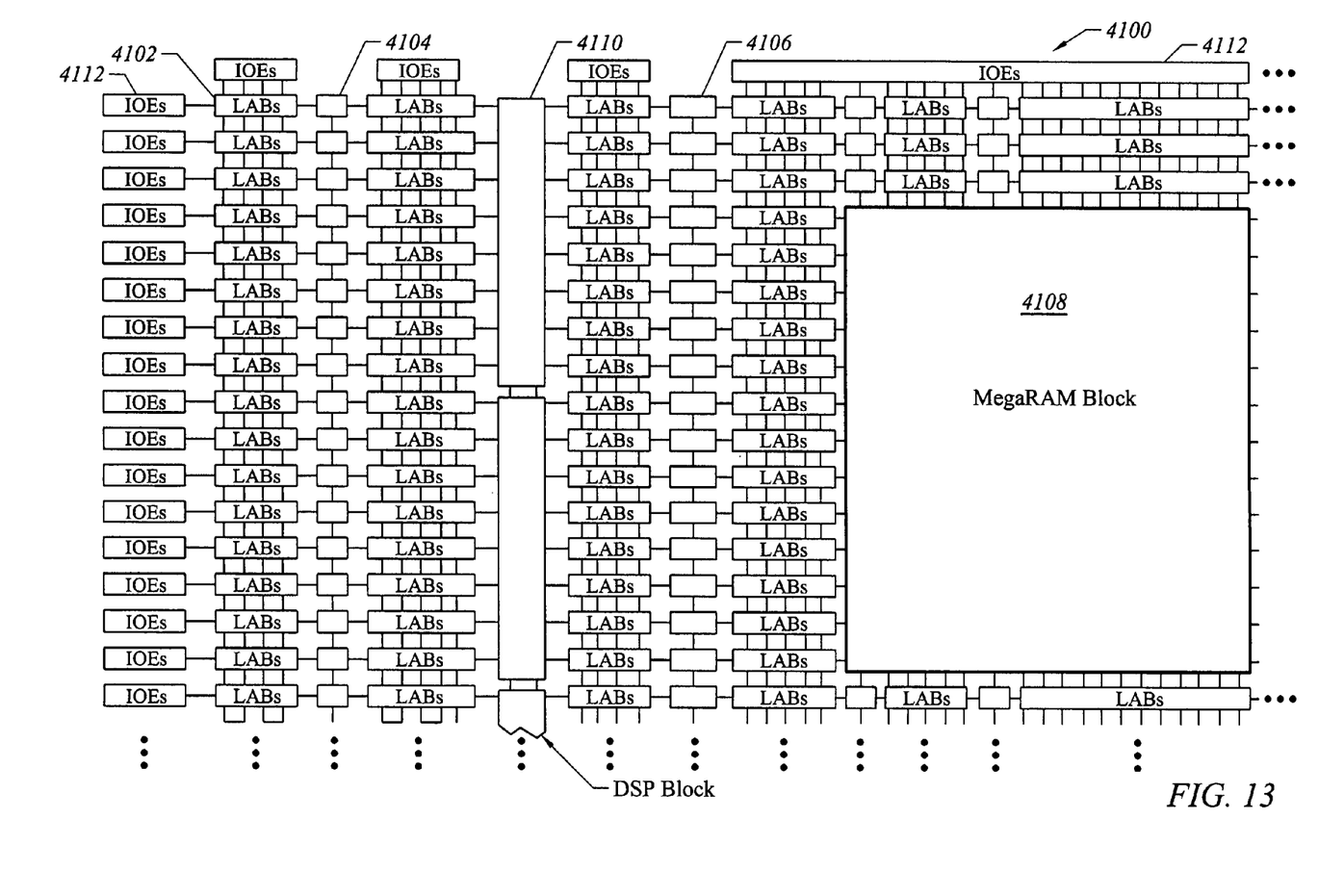
FIG. 13 is a simplified partial block diagram of an exemplary high-density programmable logic device.

The present invention has various applications. Certain embodiments of the present invention provide ESD protection to integrated circuit systems. Some embodiments of the present invention provide ESD protection to programmable logic devices. FIG. 13 is a simplified partial block diagram of an exemplary high-density programmable logic device (PLD) 4100 wherein techniques according to the present invention can be utilized. The PLD 4100 includes a two-dimensional array of programmable logic array blocks (LABs) 4102 that are interconnected by a network of column and row interconnections of varying length and speed. The LABs 4102 include multiple (e.g., 10) logic elements (LEs), an LE being a small unit of logic that provides for efficient implementation of user defined logic functions.

The PLD 4100 also includes a distributed memory structure including RAM blocks of varying sizes provided throughout the array. The RAM blocks include, for example, 512 bit blocks 4104, 4K blocks 4106 and an M-Block 4108 providing 512K bits of RAM. These memory blocks may also include shift registers and FIFO buffers. The PLD 4100 further includes digital signal processing (DSP) blocks 4110 that can implement, for example, multipliers with add or subtract features.

It is to be understood that the PLD 4100 is described herein for illustrative purposes only and that the present invention can be implemented in many different types of PLDs, FPGAs, and the other types of digital integrated circuits.

Figure 14:
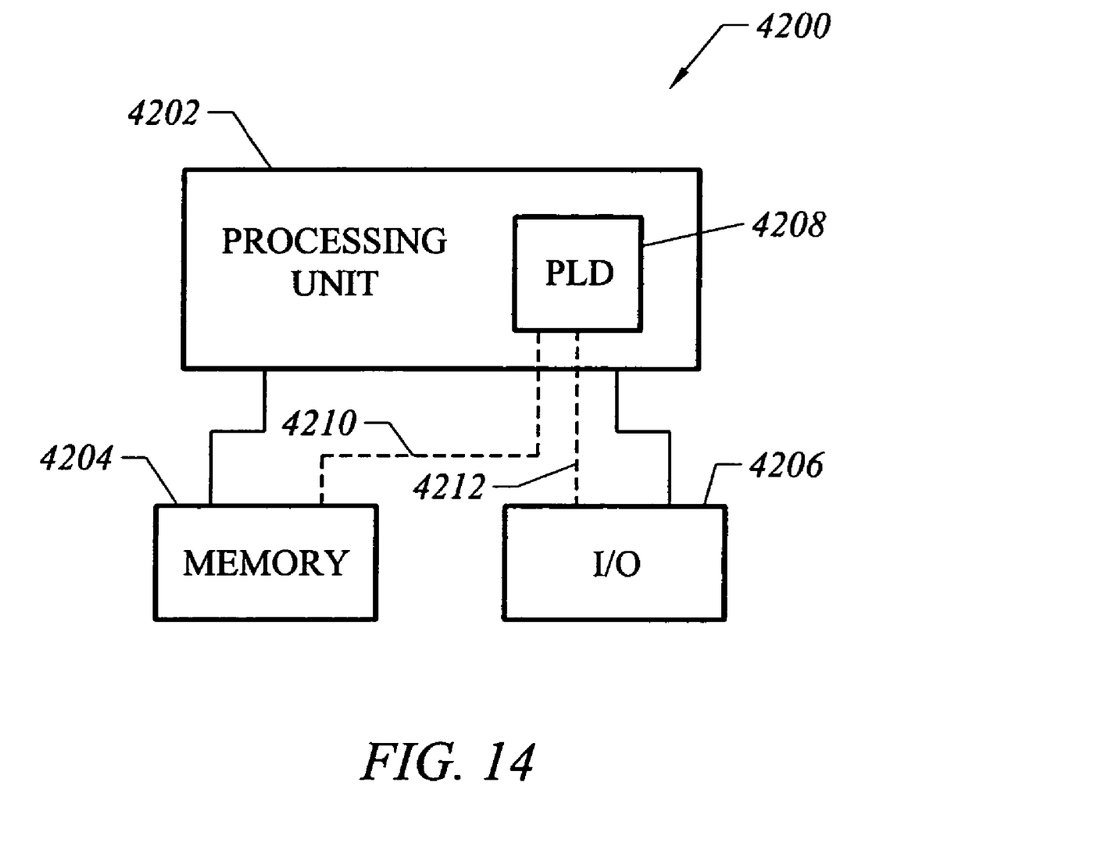
FIG. 14 shows a block diagram of an exemplary digital system.

While the PLDs of the type shown in FIG. 13 provide many of the resources required to implement system level solutions, the present invention can also benefit systems wherein a PLD is one of several components. FIG. 14 shows a block diagram of an exemplary digital system 4200, within which the present invention may be embodied. The system 4200 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, the system 4200 may be provided on a single board, on multiple boards, or within multiple enclosures.

The system 4200 includes a processing unit 4202, a memory unit 4204 and an I/O unit 4206 interconnected together by one or more buses. According to this exemplary embodiment, a programmable logic device (PLD) 4208 is embedded in the processing unit 4202. The PLD 4208 may serve many different purposes within the system in FIG. 14. The PLD 4208 can, for example, be a logical building block of the processing unit 4202, supporting its internal and external operations. The PLD 4208 is programmed to implement the logical functions necessary to carry on its particular role in system operation. The PLD 4208 may be specially coupled to the memory unit 4204 through connection 4210 and to the I/O unit 4206 through connection 4212.

The processing unit 4202 may direct data to an appropriate system component for processing or storage, execute a program stored in the memory 4204 or receive and transmit data via the I/O unit 4206, or other similar function. The processing unit 4202 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more of the PLD 4208 can control the logical operations of the system. In an embodiment, the PLD 208 acts as a reconfigurable processor, which can be reprogrammed as needed to handle a particular computing task. Alternately, the programmable logic device 4208 may itself include an embedded microprocessor. The memory unit 4204 may be a random access memory (RAM), read only memory (ROM), fixed or flexible disk media, PC Card flash disk memory, tape, or any other storage means, or any combination of these storage means.

The present invention has various advantages. Certain embodiments of the present invention provide a single device allowing ESD discharge in both polarity. For example, the single device includes both PNPN SCR and NPNP SCR, and PNPN SCR and NPNP SCR share diffusion areas. Some embodiments of the present invention provide fast turn-on of the device for effective ESD protection. Certain embodiments of the present invention provide low capacitance that allows protection of high-speed pins. Some embodiments of the present invention use smaller area than two separate SCR devices. Certain embodiments of the present invention use double triggering of the PNP and the NPN bipolar transistors. Some embodiments of the present invention provide control diodes to turn-on of either PNPN SCR or NPNP SCR. The control diodes also raise the holding voltage of PNPN SCR and NPNP SCR to eliminate or reduce the latch-up during operation.

It is understood the examples and embodiments described herein are for illustrative purposes only and that various modifications or changes in light thereof will be suggested to persons skilled in the art and are to be included within the spirit and purview of this application and scope of the appended claims.

What is claimed is:

1. A semiconductor device for electrostatic discharge protection, the semiconductor device comprising:
   a first semiconductor controlled rectifier having an anode connected to a first node and a cathode connected to a second node;
   a second semiconductor controlled rectifier having an anode connected to a third node and a cathode connected to the second node; and
   first and second diodes, the first diode being connected between the second node and the third node and the second diode being connected between the second node and the first node, wherein
   the first semiconductor controlled rectifier includes a first semiconductor region and a second semiconductor region;
   the second semiconductor controlled rectifier includes the first semiconductor region and the second semiconductor region;
   the first semiconductor region is associated with a first doping type; the second semiconductor region is associated with a second doping type different from the first doping type;
   the second semiconductor region is located directly on an insulating layer.

2. The semiconductor device of claim 1 wherein the first doping type is n-type or p-type.

3. The semiconductor device of claim 1 wherein the first semiconductor controlled rectifier further comprises:
   a third semiconductor region;
   a fourth semiconductor region;
   wherein the fourth semiconductor region is in contact with the second semiconductor region.

4. The semiconductor device of claim 3 wherein the second semiconductor controlled rectifier further comprises:
   a fifth semiconductor region;
   a sixth semiconductor region;
   wherein the sixth semiconductor region is in contact with the second semiconductor region.

5. The semiconductor device of claim 4 wherein the fourth semiconductor region and the sixth semiconductor region each are associated with the first doping type.

6. The semiconductor device of claim 5 wherein the third semiconductor region and the fifth semiconductor region each are associated with the second doping type.

7. The semiconductor device of claim 1 wherein the insulating layer comprises a dielectric material.

8. The semiconductor device of claim 7 wherein the dielectric material is selected from a group consisting of silicon, oxide, silicon nitride, and silicon oxynitride.

9. The semiconductor device of claim 1 wherein the second semiconductor region comprises a first semiconductor material selected from a group consisting of silicon, germanium, and gallium arsenide.

10. The semiconductor device of claim 9 wherein the first semiconductor material is silicon.

11. The semiconductor device of claim 1 wherein the insulating layer is on a semiconductor layer, the semiconductor layer comprising a second semiconductor material selected from a group consisting of silicon, germanium, and gallium arsenide.

12. The semiconductor device of claim 11 wherein the second semiconductor material is silicon.

13. A semiconductor device for electrostatic discharge protection, the semiconductor device comprising:
- a first semiconductor controlled rectifier having an anode connected to a first node and a cathode connected to a second node;
- a first diode connected between the second node and a third node;
- a second semiconductor controlled rectifier having an anode connected to the third node and a cathode connected to the second node; and
- a second diode connected between the second node and the first node wherein
- the first semiconductor controlled rectifier includes a first semiconductor region, a second semiconductor region, a third semiconductor region, and a fourth semiconductor region;
- the second semiconductor controlled rectifier includes the first semiconductor region, the second semiconductor region, a fifth semiconductor region, and a sixth semiconductor region;
- the second semiconductor region is in contact with the fourth semiconductor region and the sixth semiconductor region;
- the second semiconductor region, the fourth semiconductor region, and the sixth semiconductor region each are located directly on an insulating layer;
- the fourth semiconductor region and the sixth semiconductor region each are associated with a first doping type;
- the second semiconductor region is associated with a second doping type different from the first doping type.

14. The semiconductor device of claim 13 wherein the first doping type is n type or p type.

15. The semiconductor device of claim 13 wherein the third semiconductor region and the fifth semiconductor region each are associated with the second doping type.

16. The semiconductor device of claim 15 wherein the first semiconductor region is associated with the first doping type.

17. The semiconductor device of claim 13 wherein the insulating layer comprises a dielectric material.

18. The semiconductor device of claim 17 wherein the dielectric material is selected from a group consisting of silicon oxide, silicon nitride, and silicon oxynitride.

19. The semiconductor device of claim 13 wherein the second semiconductor region comprises a first semiconductor material selected from a group consisting of silicon, germanium, and gallium arsenide.

20. The semiconductor device of claim 19 wherein the first semiconductor material is silicon.

21. The semiconductor device of claim 13 wherein the insulating layer is on a semiconductor layer, the semiconductor layer comprising a second semiconductor material selected from a group consisting of silicon, germanium, and gallium arsenide.

22. The semiconductor device of claim 21 wherein the second semiconductor material is silicon.

23. The semiconductor device of claim 13 wherein the first semiconductor region, the third semiconductor region, and the fifth semiconductor region are in contact with the second semiconductor region, the fourth semiconductor region, and the sixth semiconductor region respectively.

24. An electrostatic discharge (ESD) protection device comprising:
- a first PNPN device having first and second P regions and first and second N regions, the first P region being connected to a first node and the first N region being connected to a second node;
- a second PNPN device having first and second P regions and first and second N regions, the first P region being connected to a third node and the first N region being connected to the second node;
- a first diode having a cathode connected to the first node and an anode connected to the second node; and
- a second diode having a cathode connected to the third node and an anode connected to the second node.

25. The ESD protection device of claim 24 further comprising:
- a third diode having a cathode connected to the second N region of the first PNPN device and an anode connected to the second node;
- a fourth diode having a cathode connected to the second N region of the second PNPN device and an anode connected to the second node;
- a first resistor connected between the second P region of the first PNPN device and the second node; and
- a second resistor connected between the second P region of the second PNPN device and the second node.

* * * * *